United States Patent [19]
Ryat

[11] Patent Number: 5,498,952
[45] Date of Patent: Mar. 12, 1996

[54] PRECISE CURRENT GENERATOR

[75] Inventor: Marc Ryat, Grenoble, France

[73] Assignee: SGS-Thomson Microelectronics, S.A., Gentilly Cedex, France

[21] Appl. No.: 950,091

[22] Filed: Sep. 23, 1992

[30] Foreign Application Priority Data

Sep. 30, 1991 [FR]  France .................................. 91 12278

[51] Int. Cl.$^6$ ...................................................... G05F 3/16
[52] U.S. Cl. ............................................ 323/312; 323/315
[58] Field of Search ..................................... 323/312, 313, 323/315, 316, 281, 317; 307/490, 491; 330/288

[56] References Cited

U.S. PATENT DOCUMENTS

| | | | |
|---|---|---|---|
| 4,330,744 | 5/1982 | Embree et al. ......................... | 323/316 |
| 4,437,023 | 3/1984 | Gill, Jr. ............................... | 307/296 R |
| 4,591,780 | 5/1986 | Yamada et al. ........................ | 323/313 |
| 4,703,249 | 10/1987 | De La Plaza et al. ................. | 323/316 |
| 4,733,196 | 3/1988 | Menniti et al. ........................ | 330/288 |
| 4,740,766 | 4/1988 | Metz ..................................... | 323/316 |
| 4,742,292 | 3/1988 | Hoffman ................................ | 323/314 |
| 4,970,452 | 11/1990 | Barbu et al. ........................... | 323/317 |
| 5,038,053 | 8/1991 | Djenguerian et al. .................. | 307/310 |
| 5,173,656 | 12/1992 | Seevinck et al. ....................... | 323/314 |
| 5,200,654 | 4/1993 | Archer ................................... | 307/491 |

FOREIGN PATENT DOCUMENTS

| | | |
|---|---|---|
| 3432023 | 4/1986 | Germany . |
| 60-236308 | 11/1985 | Japan . |

OTHER PUBLICATIONS

Wang et al., "A voltage-controllable linear MOS transconductor using bias offset technique" 25 IEEE Journal Of Solid-State Circuits, pp. 315–317 (Feb. 1990).

Rudy J. Van de Plassche, "A wide-band monolithic instrumentation amplifier," 10 IEEE Journal Of Solid-State Circuits 424–431 (Dec. 1975).

Pookaiyaudom et al., "An integratable precision voltage-to-currnet converter with bilaterial capability," 13 IEEE Journal Of Solid-State Circuits (Jun. 1978).

Blauschild, "An open loop programmable amplifier with extended frequency range", 16 IEEE Journal Of Solid State Circuits 626–633 (Dec. 1981).

Section 2.12 of Feucht, Handbook Of Analog Circuit Design (1990).

Primary Examiner—Steven L. Stephan
Assistant Examiner—Adolf Berhane
Attorney, Agent, or Firm—Robert Groover; Betty Formby

[57] ABSTRACT

A current generator which includes a first bipolar transistor, the base of which is connected to a reference voltage and the emitter to ground through a first resistor. A first current mirror is connected to mirror the emitter current of this first transistor. The mirrored current is augmented by the base current of a second transistor (matched to the first transistor), and by current Vbe/R passed by a second resistor (matched to the first transistor), which is connected between the base and emitter of the second transistor. The current thus augmented drives a second current mirror. The output of the second mirror provides a precise reference current, determined by the reference voltage and the resistor magnitude.

60 Claims, 2 Drawing Sheets

PRECISE CURRENT GENERATOR

BACKGROUND AND SUMMARY OF THE INVENTION

The present invention relates to a current generator, and more particularly to a generator providing, from a reference voltage Vref defined with respect to ground, a current equal to Vref/R with only a slight error, where R is a resistor value.

FIG. 1 shows a conventional circuit for such a generator. The generator comprises an operational amplifier 10 controlling the base of an NPN transistor T1, the emitter of which is connected to an inverting input of amplifier 10 and to ground G through a resistor R. The non-inverting input of amplifier 10 is provided with a reference voltage Vref with respect to ground. This reference voltage may be provided, for example, by a conventional reference voltage generator of the "Band-Gap" type, the temperature of which is stabilized. The collector of transistor T1 is connected to a current output terminal S which provides the reference current to a node of the circuit.

With this configuration, the voltage across resistor R is held to Vref, and the emitter current of transistor T1 is therefore Vref/R. The collector current Ic of transistor T1 (output current) is therefore approximately:

$$Ic \approx (1-1/\beta) \text{Vref}/R, \qquad (1)$$

where $\beta$ designates the current gain of transistor T1. In the presently preferred embodiment, this is typically about 90; but of course this specific value is supplied merely to illustrate the best mode, and is not at all necessary for practising the invention. The generator provides a current proportional to Vref which exhibits a temperature accuracy of approximately 2% over the range from $-55°$ to $+125°$ C. The inaccuracy essentially originates from the term $1/\beta$. By using a MOS transistor instead of the bipolar transistor T1, this term can be made essentially zero, which improves accuracy.

However, the implementation of such a current source requires the use of an operational amplifier. Such an operational amplifier typically includes a large number of components (about 12 transistors), and must also be connected to a compensating capacitor (not shown), since the operational amplifier operates in a closed loop mode with a unit gain. In an integrated circuit, such a current source therefore occupies a large area of silicon.

Moreover, the voltage between terminal S and ground has to remain higher than a minimum value equal to Vref+Vcesat, where Vcesat designates the emitter-collector voltage of a bipolar transistor in the saturation state. This minimum value is generally higher when a MOS transistor is used instead of transistor T1. Thus, it is not possible to properly provide current to a node having a variable voltage which may become lower than Vref+Vcesat.

The disclosed innovations advantageously provide a precise current generator which, when integrated, occupies a small silicon surface.

The disclosed innovations advantageously provide a precise current generator capable of providing a precise current to a node, the voltage of which varies within a large range.

The presently preferred embodiment provides a current generator comprising a first bipolar transistor, the base of which is connected to a reference voltage and the emitter to a first supply voltage through a first resistor; a first current mirror, the input of which is connected to the collector of the first transistor and the output is connected to the control electrode of a second transistor; a third bipolar transistor, the collector of which is connected to the output of the first current mirror, the base of which is connected to a main electrode of the second transistor and to a terminal of a second resistor, the other terminal of which is connected to the emitter of the third transistor; and a second current mirror, the input of which is connected to the emitter of the third transistor and the output provides the desired current.

According to an embodiment of the invention, the second current mirror comprises a fourth transistor, the collector of which forms the mirror input and the emitter of which is connected to the first supply voltage; at least a fifth transistor parallel-connected with the base and the emitter of the fourth transistor and the collector of which provides the desired current; and a sixth transistor, the emitter of which is connected to the base of the fourth transistor and the base is connected either to the base or to the emitter of the third transistor.

According to an embodiment of the invention, the second transistor can be either a MOS transistor, a bipolar transistor or a Darlington transistor pair.

According to an embodiment of the invention, the first current mirror is a Wilson-type mirror.

An advantage of the invention is that it is particularly adapted for manufacturing current generators with multiple outputs.

The foregoing and other objects, features, aspects and advantages of the invention will become apparent from the following detailed description of the present invention when taken in conjunction with the accompanying drawings.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 2:
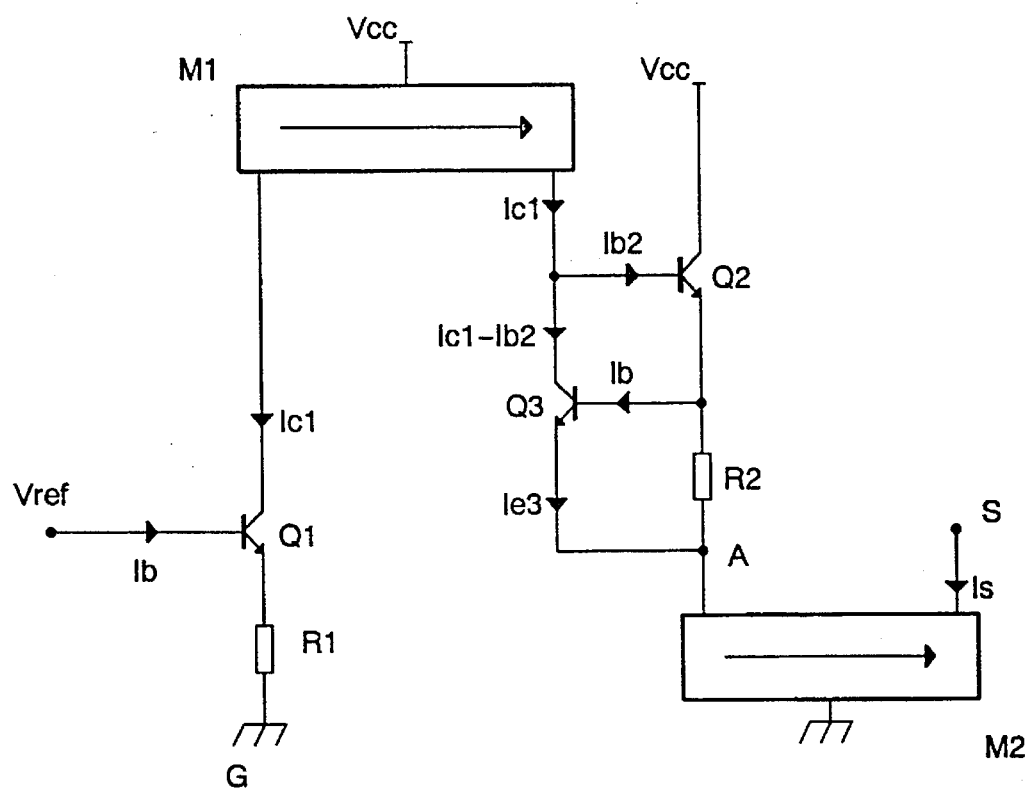
FIG. 2 shows an embodiment of a precise current generator according to the invention.

In FIG. 2, a reference voltage Vref is applied on the base of a transistor Q1. The emitter of transistor Q1 is connected to ground G through a resistor R1 having a value R. A current mirror M1, assumed to be ideal, copies current Ic1. The copied current is shared into a base current Ib2 of an NPN transistor Q2 and a collector current Ic1–Ib2 of an NPN transistor Q3. Mirror M1 is connected to a high supply voltage Vcc, and the direction of copy is indicated by an arrow. The collector of transistor Q2 is connected to voltage Vcc, and its emitter is connected to the base of transistor Q3 and to a terminal of a resistor R2 having the same value as resistor R1 (25 KΩ, in the presently preferred embodiment). The other terminal of resistor R2 is connected to a node A to which the emitter of transistor Q3 is connected. Current Is in node A is copied to an output terminal S by a current mirror M2, assumed to be ideal, connected to ground.

In the following, it is assumed that all the transistors have practically identical characteristics, especially an equal gain β, high with respect to 1, and the same base-emitter voltage drop Vbe, which is easy to implement in an integrated circuit.

With the configuration of FIG. 2, current Ic1 is exactly:

$$Ic1=(Vref-Vbe)/R-Ib, \quad (2)$$

where Ib designates the base current of transistor Q1. This base current is:

$$Ib=Ic1/\beta \approx (Vref-Vbe)/\beta R.$$

Since resistor R2 is positioned between base and emitter of transistor Q3, the current in resistor R2 is Vbe/R. This current is provided by transistor Q2, the base current of which, Ib2, is approximately $$Ib2=Vbe/\beta R. \quad (3)$$

Since the current flowing through transistor Q3 is close to the current flowing through transistor Q1, the base current of transistor Q3 has substantially the same value Ib. The emitter current of transistor Q3 is defined by:

$$Ie3=Ic1-Ib2+Ib.$$

That is, by combining equations (2) and (3):

$$Ie3=Vref/R-Vbe/R-Vbe/\beta R. \quad (4)$$

Thus, one obtains in node A and at the output of mirror M2, a current:

$$Is=Ie3+Vbe/R=Vref/R-Vbe/\beta R=(1-k/\beta)Vref/R, \quad (5)$$

where k=Vbe/Vref.

Figure 1:
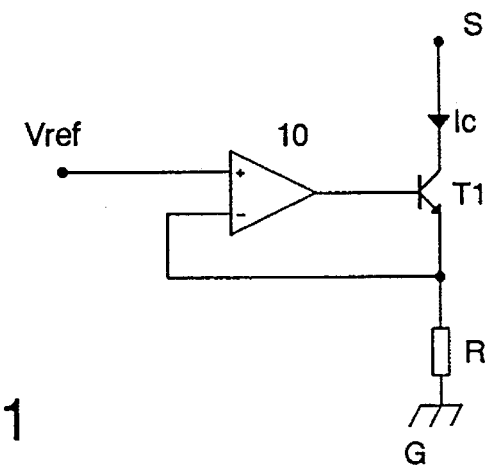
FIG. 1, above described, shows a conventional precise current generator.

Formula (5) is similar to formula (1), which describes the current Ic provided by the circuit of FIG. 1. Thus, the generator according to the invention, shown in FIG. 2, provides a current with substantially the same precision as the current of the conventional generator of FIG. 1, but has the following advantages:

the generator according to the invention occupies a substantially smaller silicon surface because it is much less complex than an operational amplifier (as seen later on, each current mirror comprises two to four transistors), and because it does not need any compensation capacitor, and by selecting an adequate mirror M2, exemplified hereunder, terminal S can be subject to a lower voltage than the minimum value Vcesat+Vref of the generator shown in FIG. 1.

If it is desired to still further increase the precision of the output current Is, the perturbing term k/β introduced by current Ib2 has to be decreased or cancelled. This can be achieved, as described in relation with FIG. 3, by replacing the bipolar transistor Q2 with a Darlington transistor or with a MOS transistor (FIG. 4) if available in the manufacturing technology.

Figure 3:
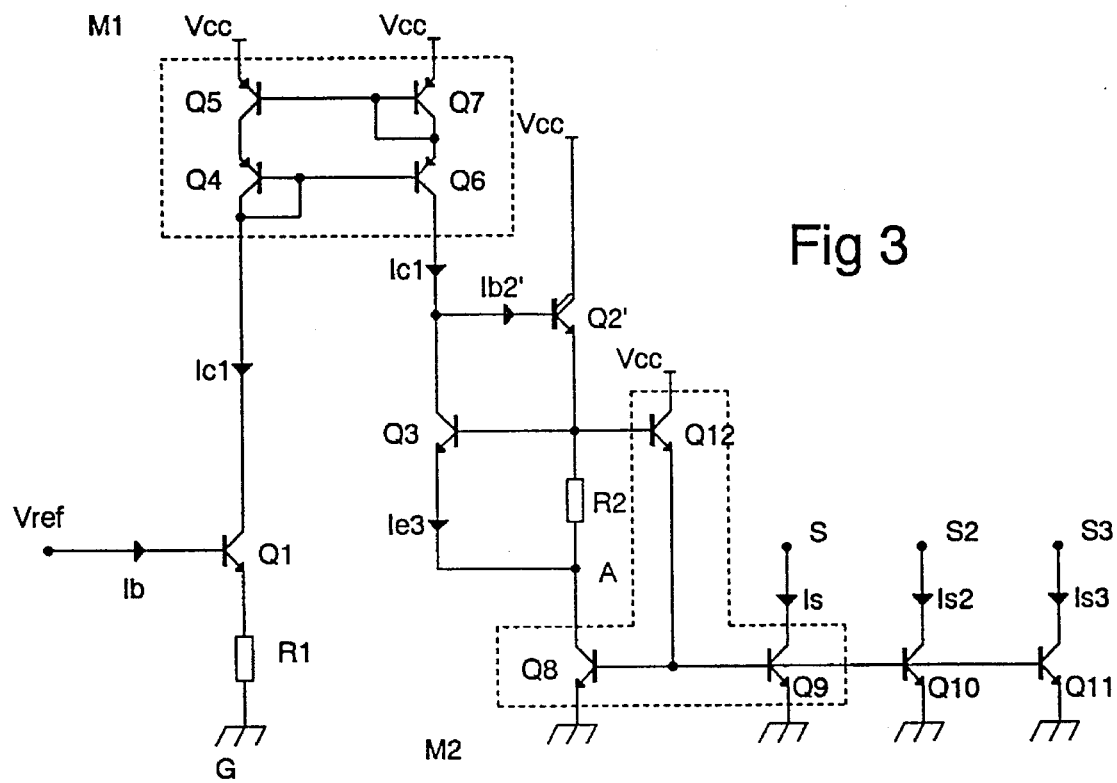
FIG. 3 shows another embodiment of a precise current generator according to the invention.

FIG. 3 shows in more detail an embodiment of the current generator according to the invention. Elements which are the same as in FIG. 2 are designated with the same references. In addition to the current output terminal S, this embodiment comprises two additional terminals S2 and S3. Here, bipolar transistor Q2 is replaced with a Darlington transistor pair Q2'.

Mirror M1, in the presently preferred embodiment, is a conventional bipolar transistor mirror of the Wilson-type (which provides nearly ideal characteristics). The mirror comprises two PNP transistors Q4, Q5 in series between the collector of transistor Q1 and supply voltage Vcc, and two additional PNP transistors Q6, Q7 in series between the collector of transistor Q3 and supply voltage Vcc. The input of mirror M1 corresponds to the shorted base-collector of transistor Q4. The mirror output corresponds to the collector of transistor Q6, the base of which is connected to the base of transistor Q4. The collector and base of transistor Q7 are shorted and connected to the base of transistor Q5.

The gain of a Darlington transistor being much higher than the one of a conventional transistor, approximately/β², its base current Ib2 becomes negligible with respect to current Is.

Mirror M2 comprises two NPN transistors, Q8 and Q9, having emitters connected to ground and bases interconnected. The collector of transistor Q8 forms the mirror input and is connected to the node A. The collector of transistor Q9 forms the mirror output and is connected to terminal S. Additional transistors, Q10 and Q11, are connected as transistor Q9 to an output terminal S2 and to an output terminal S3, respectively. The base current of transistors Q8–Q11 is provided by the emitter of an NPN transistor Q12, the collector of which is connected to the supply voltage Vcc, and the base of which is connected to the emitter of transistor Q2'. The base current consumed by transistor Q12 is negligible with respect to Is, which renders this mirror close to ideal. Of course, other current mirror circuits can be used; see generally section 2.12 of Feucht, HANDBOOK OF ANALOG CIRCUIT DESIGN (1990), which is hereby incorporated by reference.

With this configuration, all transistors having the same gain β, collector currents Is2 and Is3 will be equal to current Is, that is, Vref/R. By designing the area of transistors Q10 and Q11 to be different from that of Q9, it is possible to obtain output currents Is2 and Is3 which are predetermined fractions or multiples of current Is. Of course, additional transistors can be connected as transistors Q10 and Q11 are, in order to increase the number of current outputs.

With current mirror M2, the minimum voltage at terminals S, S2 and S3 is equal to voltage Vcesat of transistors Q9–Q11, that is, approximately 0.3 volt (instead of Vcesat+Vref in the prior art generator).

Figure 4:
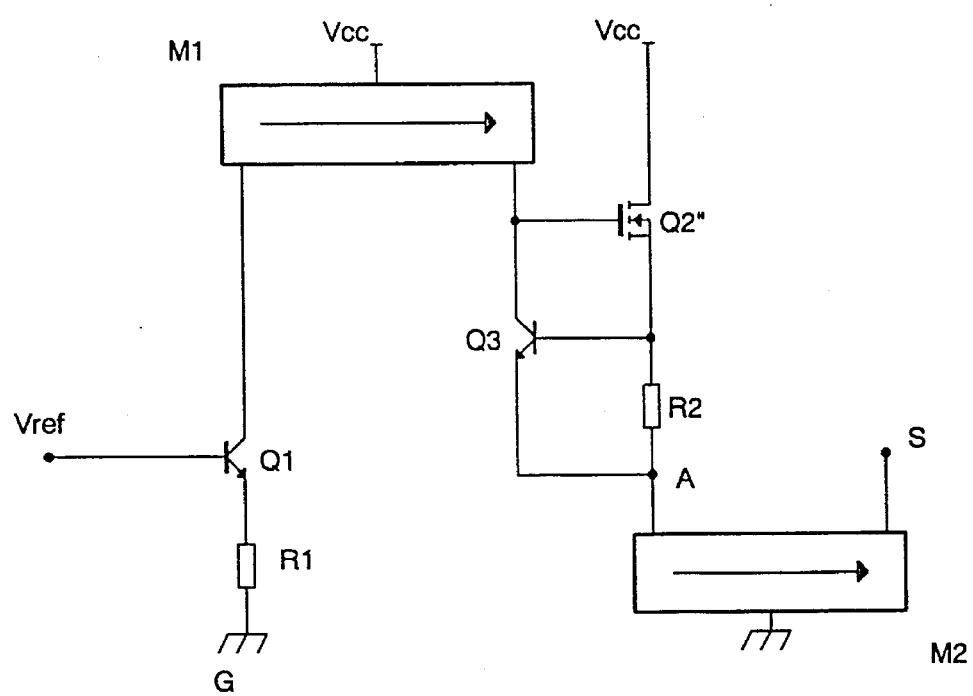
FIG. 4 shows a further embodiment of the generator according to the invention in a technology incorporating bipolar components and CMOS components (BICMOS).

FIG. 4 illustrates an embodiment in BICMOS technology of a generator according to the invention. Elements which are the same as in FIG. 2 are designated with the same references. Transistor Q2 is replaced by an N-channel MOS transistor Q2'', with a resulting null current Ib2 and a current Is strictly equal to Vref/R.

In a sample preferred embodiment, specific device parameters are: Vref=1.2 V; β=90; R1=R2=25 KΩ; and Q1 has the minimum emitter area for the process used. However, as will be readily recognized by those of ordinary skill in the art, these specific parameters are not necessary for use of the claimed innovations, and can be readily varied.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

In particular, if a current source with an opposite polarity is desired, all transistors will be replaced with complementary transistors, ground and voltage Vcc being then inverted. The base of transistor Q12 can be connected to node A instead of being connected to the base of transistor Q3. All transistors, especially the bipolar transistors of the exemplary current mirrors can be replaced with corresponding MOS transistors, but in that case the temperature stability will be less satisfactory.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A circuit, comprising:
   a connection for receiving a reference voltage;
   a first bipolar transistor connected to be controlled by said reference voltage, and to pass a first current accordingly:
   a first resistor connected in series with said first transistor;
   a first current mirror circuit, connected to receive said first current as an input, and to provide a second current, which is exactly proportional to said first current, as an output;
   a second bipolar transistor connected to pass said second current and to add a base current component thereto;
   a second resistor connected between the base and emitter of said second transistor;
   and a second current mirror circuit, operatively connected to said second transistor and said second resistor, and configured to provide a third current, as output, which is exactly proportional to the sum of the currents passed by said second resistor and second transistor;
   whereby said third current provides a stable reference current output.

2. The circuit of claim 1, embodied in an integrated circuit, wherein said first and second resistors are a matched pair.

3. The circuit of claim 1, embodied in an integrated circuit, wherein said first and second transistors are a matched pair.

4. The circuit of claim 1, wherein said second current, from said first current mirror, is substantially equal to said first current.

5. The circuit of claim 1, further comprising a third transistor, which is connected to provide said base current to said second transistor.

6. The circuit of claim 1, further comprising a third transistor, which is connected to be controlled by a portion of said output of said first current mirror circuit, and connected to provide said base current to said second transistor.

7. The circuit of claim 1, wherein said first resistor is connected to the emitter of said first transistor.

8. The circuit of claim 1, wherein said second current mirror circuit is opposite in polarity to said first current mirror circuit.

9. The circuit of claim 1, wherein said second current mirror circuit is operatively connected to receive the sum of the currents passed by said second resistor and second transistor as a single current input thereto.

10. The circuit of claim 1, wherein said second current mirror circuit is operatively connected to provide multiple current outputs, each of which is exactly proportional to the sum of the currents passed by said second resistor and second transistor.

11. The circuit of claim 1, wherein said first and second current mirror circuits both comprise field-effect transistors.

12. The circuit of claim 1, wherein said first current mirror circuit is a Wilson current mirror circuit.

13. The circuit of claim 1, wherein said first current mirror circuit is a source for said first and second currents.

14. The circuit of claim 1, wherein said second current mirror circuit is a sink for said third current.

15. The circuit of claim 1, wherein said second current mirror circuit comprises: a bipolar input transistor which passes the combined currents passed by said second resistor and second transistor; and at least one bipolar output transistor, having a base and emitter connected in common with said bipolar input transistor; and an additional transistor, having a base connected to the base of said second transistor, and connected to provide current to said base of said input transistor.

16. The circuit of claim 1, wherein said first bipolar transistor is an npn transistor.

17. The circuit of claim 1, wherein said first and second bipolar transistors are both npn transistors.

18. A circuit, comprising:
   a connection for receiving a reference voltage;
   a first bipolar transistor connected to be controlled by said reference voltage, and to pass a first current accordingly:
   a first resistor connected in series with said first transistor;
   a first current mirror circuit, connected to receive said first current as an input, and to provide a second current, which is substantially equal to said first current, as an output;
   a second bipolar transistor, matched to said first bipolar transistor and connected to pass said second current and to add a base current component thereto;
   a second resistor, matched to said first resistor, and connected between the base and emitter of said second transistor;
   a third transistor, connected to provide said base current to said second transistor;
   and a second current mirror circuit, operatively connected to said second transistor and said second resistor, and configured to provide a third current, as output, which is exactly proportional to the sum of the currents passed by said second resistor and second transistor;
   whereby said third current provides a stable reference current which closely approximates said reference voltage divided by the value of said first resistor.

19. The circuit of claim 18, embodied in an integrated circuit, wherein said first and second resistors are a matched pair.

20. The circuit of claim 18, embodied in an integrated circuit, wherein said first and second transistors are a matched pair.

21. The circuit of claim 18, wherein said second current, from said first current mirror, is substantially equal to said first current.

22. The circuit of claim 18, wherein said third transistor is connected to be controlled by a portion of said output of said first current mirror circuit.

23. The circuit of claim 18, wherein said third transistor comprises a Darlington transistor pair.

24. The circuit of claim 18, wherein said third transistor is a field-effect transistor.

25. The circuit of claim 18, wherein said first resistor is connected to the emitter of said first transistor.

26. The circuit of claim 18, wherein said second current mirror circuit is opposite in polarity to said first current mirror circuit.

27. The circuit of claim 18, wherein said second current mirror circuit is operatively connected to receive the sum of the currents passed by said second resistor and second transistor as a single current input thereto.

28. The circuit of claim 18, wherein said second current mirror circuit is operatively connected to provide multiple current outputs, each of which is exactly proportional to the sum of the currents passed by said second resistor and second transistor.

29. The circuit of claim 18, wherein said first and second current mirror circuits both comprise field-effect transistors.

30. The circuit of claim 18, wherein said first current mirror circuit is a Wilson current mirror circuit.

31. The circuit of claim 18, wherein said first current mirror circuit is a source for said first and second currents.

32. The circuit of claim 18, wherein said second current mirror circuit is a sink for said third current.

33. The circuit of claim 18, wherein said second current mirror circuit comprises: a bipolar input transistor which passes the combined currents passed by said second resistor and second transistor; and at least one bipolar output transistor, having a base and emitter connected in common with said bipolar input transistor; and an additional transistor, having a base connected to the base of said second transistor, and connected to provide current to said base of said input transistor.

34. The circuit of claim 18, wherein said first and second bipolar transistors are both npn transistors.

35. A circuit, comprising:
a connection for receiving a reference voltage;
a first bipolar transistor having a base connected to said reference voltage, and an emitter connected, through a first resistor, to a first supply voltage, and a collector connected to pass a first current accordingly;
a first current mirror circuit, connected to receive said first current as an input, and to provide a second current, which is substantially equal to said first current, as an output;
a second bipolar transistor, matched to said first bipolar transistor and connected to receive said second current at a collector thereof, and to pass said second current, plus a base current component, at the emitter thereof;
a second resistor, matched to said first resistor, and connected between the base and emitter of said second transistor;
and a second current mirror circuit opposite in polarity to said first current mirror circuit, operatively connected to said second transistor and said second resistor, and configured to provide a third current, as output, which is exactly proportional to the sum of the currents passed by said second resistor and said emitter of said second transistor;
whereby said third current provides a stable reference current which closely approximates said reference voltage divided by the value of said first resistor.

36. The circuit of claim 35, embodied in an integrated circuit, wherein said first and second resistors are a matched pair.

37. The circuit of claim 35, embodied in an integrated circuit, wherein said first and second transistors are a matched pair.

38. The circuit of claim 35, wherein said second current, from said first current mirror, is substantially equal to said first current.

39. The circuit of claim 35, further comprising a third transistor, which is connected to provide said base current to said second transistor.

40. The circuit of claim 35, further comprising a third transistor, which is connected to be controlled by a portion of said output of said first current mirror circuit, and connected to provide said base current to said second transistor.

41. The circuit of claim 35, wherein said third transistor is connected to be controlled by a portion of said output of said first current mirror circuit.

42. The circuit of claim 35, wherein said third transistor comprises a Darlington transistor pair.

43. The circuit of claim 35, wherein said third transistor is a field-effect transistor.

44. The circuit of claim 35, wherein said first resistor is connected to the emitter of said first transistor.

45. The circuit of claim 35, wherein said second current mirror circuit is opposite in polarity to said first current mirror circuit.

46. The circuit of claim 35, wherein said second current mirror circuit is operatively connected to receive the sum of the currents passed by said second resistor and second transistor as a single current input thereto.

47. The circuit of claim 35, wherein said second current mirror circuit is operatively connected to provide multiple current outputs, each of which is exactly proportional to the sum of the currents passed by said second resistor and second transistor.

48. The circuit of claim 35, wherein said first and second current mirror circuits both comprise field-effect transistors.

49. The circuit of claim 35, wherein said first current mirror circuit is a Wilson current mirror circuit.

50. The circuit of claim 35, wherein said first current mirror circuit is a source for said first and second currents.

51. The circuit of claim 35, wherein said second current mirror circuit is a sink for said third current.

52. The circuit of claim 35, wherein said second current mirror circuit comprises: a bipolar input transistor which passes the combined currents passed by said second resistor and second transistor; and at least one bipolar output transistor, having a base and emitter connected in common with said bipolar input transistor; and an additional transistor, having a base connected to the base of said second transistor, and connected to provide current to said base of said input transistor.

53. The circuit of claim 35, wherein said first bipolar transistor is an npn transistor.

54. The circuit of claim 35, wherein said first and second bipolar transistors are both npn transistors.

55. A current generator comprising:
a first transistor, having a base connected to a reference voltage and an emitter connected to a first supply voltage through a first resistor;
a first current mirror, having an input which is connected to the collector of said first transistor and an output which is connected to a control electrode of a second transistor;
a third transistor, having a collector which is connected to the output of said first current mirror, and a base which is connected to a main electrode of said second transistor and to a terminal of a second resistor, the other terminal of said second resistor being connected to the emitter of said third transistor; and a second current mirror, having an input which is connected to the emitter of said third transistor and an output which is connected to provide said current.

56. The current generator of claim 55, wherein said second current mirror comprises:

a fourth transistor, the collector of which forms the mirror input, and the emitter of which is connected to said first supply voltage;

at least a fifth transistor parallel connected to the base and emitter of said fourth transistor, the collector of which provides said current; and a sixth transistor, the emitter of which is connected to the base of said fourth transistor and the base is connected, either to the base or to the emitter of said third transistor.

57. The current generator of claim 55, wherein said second transistor is a MOS transistor.

58. The current generator of claim 55, wherein said second transistor is a bipolar transistor.

59. The current generator of claim 55, wherein said second transistor is a Darlington transistor pair.

60. The current generator of claim 55, wherein said first current mirror is a Wilson-type mirror.

* * * * *